(12) United States Patent
Christensen et al.

(10) Patent No.: US 9,147,792 B2
(45) Date of Patent: Sep. 29, 2015

(54) METHOD OF PROVIDING CHLORIDE TREATMENT FOR A PHOTOVOLTAIC DEVICE AND A CHLORIDE TREATED PHOTOVOLTAIC DEVICE

(71) Applicant: First Solar, Inc., Perrysburg, OH (US)

(72) Inventors: Scott Christensen, Perrysburg, OH (US); Rick C. Powell, Ann Arbor, MI (US); Gang Xiong, Santa Clara, CA (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 13/897,915

(22) Filed: May 20, 2013

(65) Prior Publication Data

US 2013/0312824 A1 Nov. 28, 2013

Related U.S. Application Data

(60) Provisional application No. 61/649,403, filed on May 21, 2012.

(51) Int. Cl.
| | |
|---|---|
| *H01L 21/00* | (2006.01) |
| *H01L 31/18* | (2006.01) |
| *H01L 31/0296* | (2006.01) |
| *H01L 31/073* | (2012.01) |

(52) U.S. Cl.
CPC ........ *H01L 31/1828* (2013.01); *H01L 31/0296* (2013.01); *H01L 31/073* (2013.01); *H01L 31/1864* (2013.01); *H01L 31/1872* (2013.01); *Y02E 10/543* (2013.01)

(58) Field of Classification Search
CPC ............... H01L 31/02168; H01L 31/022425; H01L 31/1804; H01L 27/14685; H01L 31/073; H01L 31/1836; H01L 31/1828; H01L 31/02963; Y02E 10/50; Y02E 10/543
USPC ........................................................ 438/72
See application file for complete search history.

(56) References Cited

U.S. PATENT DOCUMENTS

| | | | |
|---|---|---|---|
| 4,873,198 A * | 10/1989 | Meyers et al. | ........... 438/94 |
| 7,229,497 B2 | 6/2007 | Stott et al. | |
| 7,316,967 B2 | 1/2008 | Yen et al. | |
| 7,449,237 B2 | 11/2008 | Chan et al. | |
| 7,862,892 B2 | 1/2011 | Chan et al. | |
| 2005/0189518 A1 | 9/2005 | Arakawa | |

(Continued)

FOREIGN PATENT DOCUMENTS

EP 2 337 088 A2 6/2011

OTHER PUBLICATIONS

N. Romeo et al., "High Efficiency CdTe/CdS Thin Film Solar Cells Prepared by Treating CdTe Films with a Freon Gas in Substitution of $CdCl_2$." 21st European Photovoltaic Solar Energy Conference, pp. 1857-1860, Sep. 4-8, 2006.

(Continued)

*Primary Examiner* — Michelle Mandala
(74) *Attorney, Agent, or Firm* — Dickstein Shapiro LLP

(57) ABSTRACT

A method of manufacturing a photovoltaic device including depositing a cadmium telluride layer onto a substrate; treating the cadmium telluride layer with a compound comprising chlorine and an element from Groups 1-11, zinc, mercury, or copernicium or a combination thereof; and annealing the cadmium telluride layer. A chloride-treated photovoltaic device.

14 Claims, 12 Drawing Sheets

(56) References Cited

U.S. PATENT DOCUMENTS

| | | | |
|---|---|---|---|
| 2006/0114960 A1 | 6/2006 | Snee et al. | |
| 2009/0020149 A1 | 1/2009 | Woods et al. | |
| 2010/0059112 A1 | 3/2010 | Gupta et al. | |
| 2010/0148152 A1 | 6/2010 | Dorn et al. | |
| 2010/0261304 A1 | 10/2010 | Chang et al. | |
| 2011/0143489 A1 | 6/2011 | Korevaar | |
| 2011/0259424 A1* | 10/2011 | Basol | 136/260 |
| 2013/0074914 A1* | 3/2013 | Foust et al. | 136/256 |

OTHER PUBLICATIONS

B. F. McCandless et al., "Processing Options for CdTe Thin Film Solar Cells." Solar Energy, vol. 77, pp. 839-856, 2004.

T. Potlog et al., "Influence of Annealing in Different Chlorides on the Photovoltaic Parameters of CdS/CdTe Solar Cells." Solar Energy Materials & Solar Cells, vol. 80, pp. 327-334, 2003.

A.D. Compaan et al., "Sputtered II-VI Alloys and Structures for Tandem PV." Final Subcontract Report Dec. 9, 2003-Jul. 30, 2007, National Renewable Energy Laboratory—Subcontract Report NREL/SR-520-43954, Sep. 2008.

O.S. Martinez et al., "Development of Wide Band Gap $Cd_{1-x}Mg_xTe$/CdS Top Cells for Tandem Devices." Photovoltaic Specialists Conference, 33rd IEEE, pp. 1-5, 2008.

J. Huang et al., "$Cd_{1-x}Mn_xTe$ Thin Films Deposited by Close-Spaced Sublimation for Application in Solar Cells." Vacuum, vol. 86, pp. 303-305, 2011.

X. Mathew et al., "Development of a Semitransparent CdMgTe/CdS Top Cell for Applications in Tandem Solar Cells." Semiconductor Science and Technology, vol. 24, No. 015012, pp. 1-9, 2009.

S. Wang et al., "Spectroscopic Ellipsometry and Atomic Force Microscopy Studies of RF Sputtered $Cd_{1-x}Mn_xTe$ Films." Photovoltaic Specialists Conference, 2005, Conference Record of the Thirty-first IEEE. Jan. 3-7, 2005, pp. 480-483, (Abstract).

E. Gómez-Barojas et al., "Study of the Influence of Annealing Parameters on the Optical and Compositional Properties of ZnS, ZnS:Mn and ZnS:Sm Grown by Sol Gel." Journal of Physics: Conference Series vol. 167, No. 012051, pp. 1-5, 2009.

M.D.G. Potter et al., "A Study of the Effects of Varying Cadmium Chloride Treatment on the Luminescent Properties of CdTe/CdS Thin Film Solar Cells." Thin Solid Films, vol. 361-362, pp. 248-252, 2000.

* cited by examiner

METHOD OF PROVIDING CHLORIDE TREATMENT FOR A PHOTOVOLTAIC DEVICE AND A CHLORIDE TREATED PHOTOVOLTAIC DEVICE

CLAIM OF PRIORITY

This application claims priority under 35 U.S.C. §119(e) to U.S. Provisional Patent Application Ser. No. 61/649,403 filed on May 21, 2012, which is hereby incorporated by reference in its entirety.

TECHNICAL FIELD

Disclosed embodiments relate generally to the manufacture of photovoltaic devices, which include photovoltaic cells and photovoltaic modules containing a plurality of photovoltaic cells, and more particularly to a method of providing chloride treatment for a photovoltaic device and a chloride treated photovoltaic device.

BACKGROUND

Thin-film photovoltaic devices can include semiconductor material deposited over a substrate, for example, with a first semiconductor layer serving as a window layer, a second semiconductor layer serving as an absorber layer. The window layer and the absorber layer form a junction where light that passes through the window to the absorber layer is converted to electricity.

A reflector layer, which may be made of zinc telluride, may be provided between the absorber layer and a back contact layer to provide a barrier against minority electron carrier flow toward the back contact layer to minimize recombination with hole carriers at the back contact layer. Specifically, semiconductor materials, like any other solids, have an electronic band structure consisting of a valence band, a conduction band and a band gap separating them. When an electron in the valence band acquires enough energy to jump over the band gap and reach the conduction band, it can flow freely as current. Furthermore, it will also leave behind an electron hole in the valence band that can flow as freely as current. Carrier generation describes processes by which electrons gain energy and move from the valence band to the conduction band, producing two mobile carriers: an electron and a hole; while recombination describes processes by which a conduction band electron loses energy and re-occupies the energy state of an electron hole in the valence band. In a p-type semiconductor material like the absorber layer, electrons are less abundant than holes, hence they are referred to as minority carriers whereas holes are referred to as majority carriers. The reflector layer is made of a semiconductor material with an electron affinity that is lower than that of the absorber layer. The reflector layer therefore repels electron flow toward the reflector layer back toward the absorber layer, thus minimizing recombination at the back contact. This is described in U.S. Provisional Patent Application 61/547,924, entitled "Photovoltaic Device And Method Of Formation," filed on Oct. 17, 2011.

During manufacture of photovoltaic devices, absorber layers are sometimes subjected to cadmium chloride treatments in order to improve the absorber layers' crystalline quality (e.g., increasing grain (crystallite) size and curing defects in the crystal lattice including defects located at grain boundary areas. Defects in the lattice structure including grain boundaries are sources of carrier recombination, which reduces photovoltaic efficiency. A cadmium chloride treatment includes exposing the absorber layer, which may be made of cadmium telluride, to cadmium chloride and heating the absorber layer to an anneal temperature afterwards. The heat helps the chlorine atoms diffuse preferentially through grain boundary areas in the cadmium telluride (i.e., interfaces where crystal grains of different orientations meet). The chlorine atoms further increase the conductivity of the cadmium telluride film by facilitating re-crystallization and curing of defects. Improvements in conductivity and reduction of defects that cause recombination increase photovoltaic efficiency.

However, cadmium chloride treatments have potential disadvantages. For example, in photovoltaic devices having a reflector layer formed of zinc telluride adjacent to the back contact layer, the zinc telluride reflector layer may react with the cadmium chloride to form zinc chloride and cadmium telluride. The reaction between cadmium chloride and zinc telluride is thermodynamically favorable (i.e., the products of the reaction are at a lower energy than the reactants). This reaction consumes the zinc telluride, which erodes (depletes) the reflector layer and may result in reduced ohmic contact (i.e., a low resistance junction that provides electric current conduction between a metal and a semiconductor) between the reflector layer and the back contact layer over time. Such a reduced ohmic contact may impair the delivery of generated electrical power to external devices.

Thus, there is a need to solve this problem by treating the absorber layer with chloride compounds that do not react with the zinc telluride reflector layer. It is believed that a reaction between such chloride compounds and the zinc telluride reflector layer is not thermodynamically favorable. Erosion of the zinc telluride reflector layer is therefore limited.

Accordingly, treatment of photovoltaic devices with an alternative chloride compound that obviates the effect of the above-mentioned potential problems is desirable.

DETAILED DESCRIPTION

In the following detailed description, reference is made to the accompanying drawings which form a part hereof, and in which is shown by way of illustration specific embodiments that may be practiced. These embodiments are described in sufficient detail to enable those skilled in the art to make and use them, and it is to be understood that structural, logical, or procedural changes may be made to the specific embodiments disclosed without departing from the spirit and scope of the invention.

Embodiments described herein provide a photovoltaic device and method of manufacturing a photovoltaic device that involves treating an absorber layer, which may be made of cadmium telluride, with a chloride compound containing one or more elements from Groups 1-11, zinc, mercury and copernicium. The chloride compound may replace the current cadmium chloride treatment which can cause reflector layer erosion, if provided, as described above. Two exemplary compounds are manganese chloride and magnesium chloride. The chloride compound prevents or at least reduces reflector layer erosion associated with cadmium chloride treatment of the cadmium telluride layer because the reaction of zinc telluride and cadmium telluride, also discussed above, is avoided.

The chloride compound may be deposited over the absorber layer either during or after absorber layer deposition. Chloride compound deposition either during or after absorber layer deposition provides for direct incorporation of chlorine atoms into the absorber layer film. Alternatively, if a reflector layer is present, the chloride compound may be deposited either during or after reflector layer deposition. If deposited after reflector layer deposition, the chloride compound diffuses into the underlying absorber layer. In addition, an annealing step to activate the absorber layer and increase crystal grain size and promote re-crystallization within the absorber layer may occur during the chloride compound deposition, or the annealing step may follow chloride compound deposition. If a reflector layer is present, and chloride treatment occurs during or after reflector layer deposition, the annealing helps the chlorine atoms diffuse through the reflector layer into the absorber layer.

Figure 1:
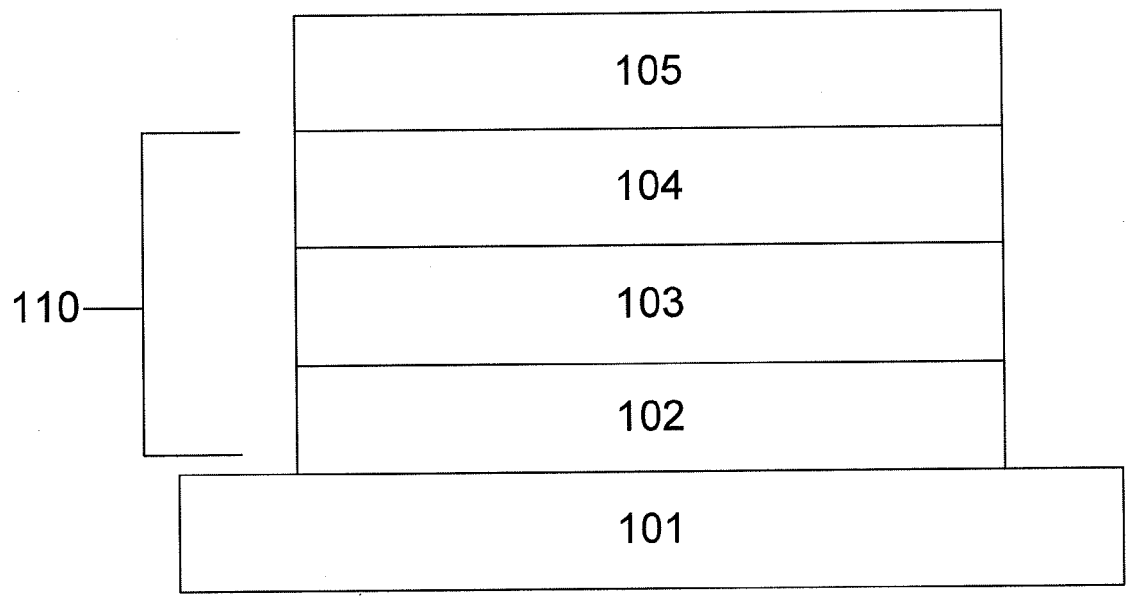
FIG. 1 is a cross-sectional view of an unfinished photovoltaic device.

Referring to FIG. 1, an example of an unfinished photovoltaic device 10 is shown. The unfinished photovoltaic device 10 has a substrate 101 upon which a barrier layer 102, a transparent conductive oxide (TCO) layer 103, a buffer layer 104, and a semiconductor window layer 105 are respectively deposited. Barrier layer 102, TCO layer 103 and buffer layer 104 are often referred to as a TCO stack 110. As shown, the TCO stack 110 includes TCO layer 103, which serves as one of the electrical contacts for the unfinished photovoltaic device 10.

Substrate 101 can be the outermost layer of the device 10 and, in use, may be exposed to a variety of temperatures and environmental conditions. Substrate 101 may also be the first layer that incident light encounters upon reaching the device 10. It is therefore desirable to select a material for the substrate 101 that is both durable and highly transparent. For these reasons, the substrate 101 may include, for example, borosilicate glass, soda lime glass, or float glass. The barrier layer 102 is positioned between the substrate 101 and the TCO layer 103 to lessen diffusion of sodium or other contaminants from the substrate 101 to the window layer 105. Specifically, high processing temperatures have a tendency to ionize sodium atoms or molecules present in the substrate 101, which over time, may diffuse to other layers of the device 10. The diffusion of sodium atoms in certain layers of the device may adversely affect the device's performance. Thus, the barrier layer 102 is used to reduce or eliminate loss of performance due to sodium ion diffusion. The barrier layer 102 may be made of various materials including silicon nitride, silicon dioxide, aluminum-doped silicon oxide, boron-doped silicon nitride, phosphorus-doped silicon nitride, silicon oxide-nitride, or any combination or alloy thereof.

The TCO layer 103 may include any suitable TCO materials, including, for example, cadmium stannate or a cadmium tin oxide. The buffer layer 104 is positioned between TCO layer 103 and window layer 105 to decrease irregularities occurring during the formation of the semiconductor layer. Particularly, certain processes used to form the TCO layer 103 may generate a rough TCO layer. The rougher the TCO layer the more likely there may be discontinuities in the window layer that may be deposited over the TCO layer. The buffer layer 104 is used then to provide a smooth surface upon which the window layer 105 may be deposited and thus lowers the risk of discontinuities in the window layer 105. The buffer layer 104 may include various suitable materials, including, for example, tin oxide (e.g., tin (IV) oxide), zinc tin oxide, zinc oxide or zinc magnesium oxide.

The window layer 105 may be a layer of cadmium sulfide formed over the TCO stack 110. The window layer 105 may alternatively be formed of cadmium zinc sulfide, which has proven more robust than cadmium sulfide for its ability to withstand high anneal temperatures during chloride treatment of the absorber layer.

Figure 2:
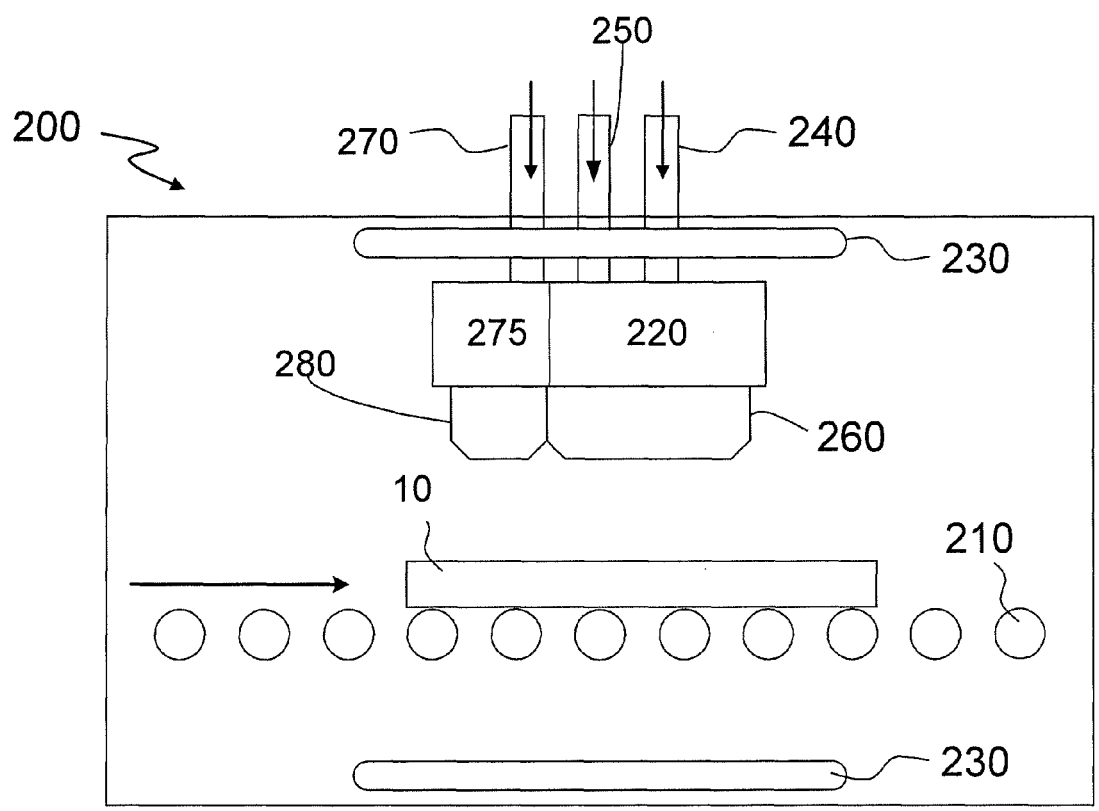
FIG. 2 is a schematic of a deposition oven used for chloride treatment during absorber layer deposition according to an embodiment described herein.

FIG. 2 illustrates a schematic of a deposition oven used for chloride treatment during absorber layer deposition according to an embodiment. In this embodiment, the absorber layer undergoes chloride compound treatment during its deposition in an oven 200. Like cadmium chloride treatment, this chloride compound treatment also increases crystal grain size within the absorber layer and improves device 10 efficiency. The absorber layer may be formed of cadmium telluride, although other absorber layer materials may be used. Although this and other embodiments describe using a vapor transport deposition process, any suitable semiconductor deposition process may be used.

Unfinished device 10 is transported through the oven 200 on a transport mechanism, for example, conveyor rollers 210 in a continuous process. Although the transport mechanism is shown to be rollers in this particular embodiment, it is not limiting. The transport mechanism can as well be a belt, or any other types of conveying means. Rollers are used for illustrative reasons only. The oven 200 includes a first in-situ vaporization unit 275 to vaporize raw semiconductor material in powder form, for example, cadmium telluride for the absorber layer, supplied to the first in-situ vaporization unit 275 through a semiconductor input line 270. Vaporized cadmium telluride is introduced into the oven ambient through a diffuser 280 and deposited onto the moving unfinished photovoltaic device 10 in an amount and at an appropriate location to deposit a desired amount of cadmium telluride on the unfinished photovoltaic device 10.

During semiconductor absorber layer deposition, a chloride compound is deposited. The chloride compound contains one or more elements from Groups 1-11, zinc, mercury and copernicium. Two exemplary compounds are manganese chloride and magnesium chloride. The chloride compound can be deposited in vapor or liquid form. The oven 200 includes a second in-situ vaporization unit 220 to vaporize the chloride compound inside the oven 200 prior to treatment. The chloride compound may be provided to the second in-situ vaporization unit 220 through an input line 250, for example, in solid (e.g., powder) form or in liquid form. If provided in liquid form, the chloride compound may be provided as about a 0.14 molar to about a 2.18 molar aqueous solution, or about a 0.5 molar aqueous solution to about a 1.2 molar aqueous solution, for example, about a 1.1 molar or about a 0.54 molar aqueous solution.

A carrier gas may optionally be supplied to the second in-situ vaporization unit 220 through an optional carrier gas input line 240 to distribute the vaporized chloride compound. The carrier gas used can be hydrogen, helium, nitrogen, neon, argon, krypton, and mixtures containing these gases, or any suitable inert gas. Alternatively, the carrier gas may be omitted and the chloride compound vapor may diffuse under ambient conditions. Chloride compound treatment may occur in any suitable oven, including those described in U.S. Provisional Patent Application Ser. No. 61/561,375, entitled "Method And Apparatus Providing Single Step Vapor Chloride Treatment For Photovoltaic Modules," filed on Nov. 8, 2011, the disclosure of which is hereby incorporated by reference in its entirety.

The chloride compound is introduced into the oven ambient through a diffuser 260 and deposited onto the moving unfinished photovoltaic device 10 in an amount and at an appropriate location to deposit a desired amount of chloride compound onto the device 10 in a continuous process, for example. If the chloride compound is deposited in liquid form, second in-situ vaporization unit 220 may be omitted and the input line 250 would supply liquid chloride compound directly to one or more sprayers which would replace diffuser 260, similar to the FIG. 8 embodiment described below.

The oven 200 may include a plurality of heaters 230 to maintain an appropriate temperature for absorber layer deposition. In this embodiment, the chloride compound is deposited during cadmium telluride layer deposition. The absorber layer and the chloride compound are therefore deposited at the same temperature. Cadmium telluride deposition typically occurs at vapor transport deposition (VTD) temperatures of about 400° C. to about 750° C. The annealing step may occur simultaneously with, or after, chloride compound deposition. The temperature maintained during absorber layer and chloride compound co-deposition depends on the concentration of the chloride compound used. For example, if about a 0.14 molar to about a 2.18 molar aqueous solution is provided to vaporization unit 220, the unfinished photovoltaic device 10 can be heated at a temperature from about 400° C. to about 460° C., or from about 415° C. to about 455° C. A 0.5 molar to about a 1.2 molar chloride compound aqueous solution may be employed. For example, if about a 0.54 molar aqueous solution is provided, the unfinished photovoltaic device 10 can be heated at a temperature from about 435° C. to about 445° C. If about a 1.1 molar aqueous solution is provided, the unfinished photovoltaic device 10 can be heated at a temperature from about 400° C. to about 450° C., or about 425° C. Higher temperatures within the VTD temperature range of about 400° C. to about 750° C. may also be used. The absorber layer may be heated for anywhere between about 7 minutes and about 12 minutes, for example, about 11 minutes. Similar temperature and time parameters are used if the chloride compound is provided in powder form.

In contrast to the prior art, and as discussed below, it has been determined that the disclosed chloride compounds do not react with the zinc telluride reflector layer, if provided. Therefore, zinc telluride is not consumed, a zinc chloride by-product is not produced, and reflector layer erosion is limited.

Figure 3:
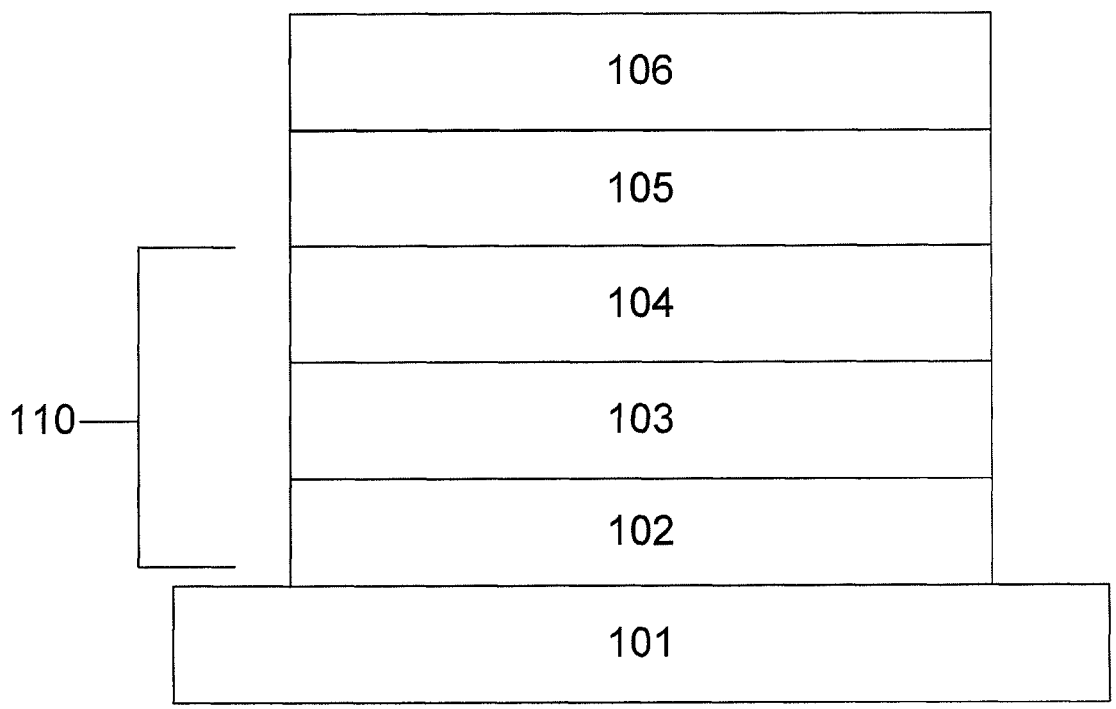
FIG. 3 is a cross-sectional view of an unfinished photovoltaic device.

FIG. 3 illustrates a schematic of a photovoltaic device 12 after absorber layer 106 deposition. The absorber layer 106 in FIG. 3 has not been treated with a chloride compound.

Figure 4:
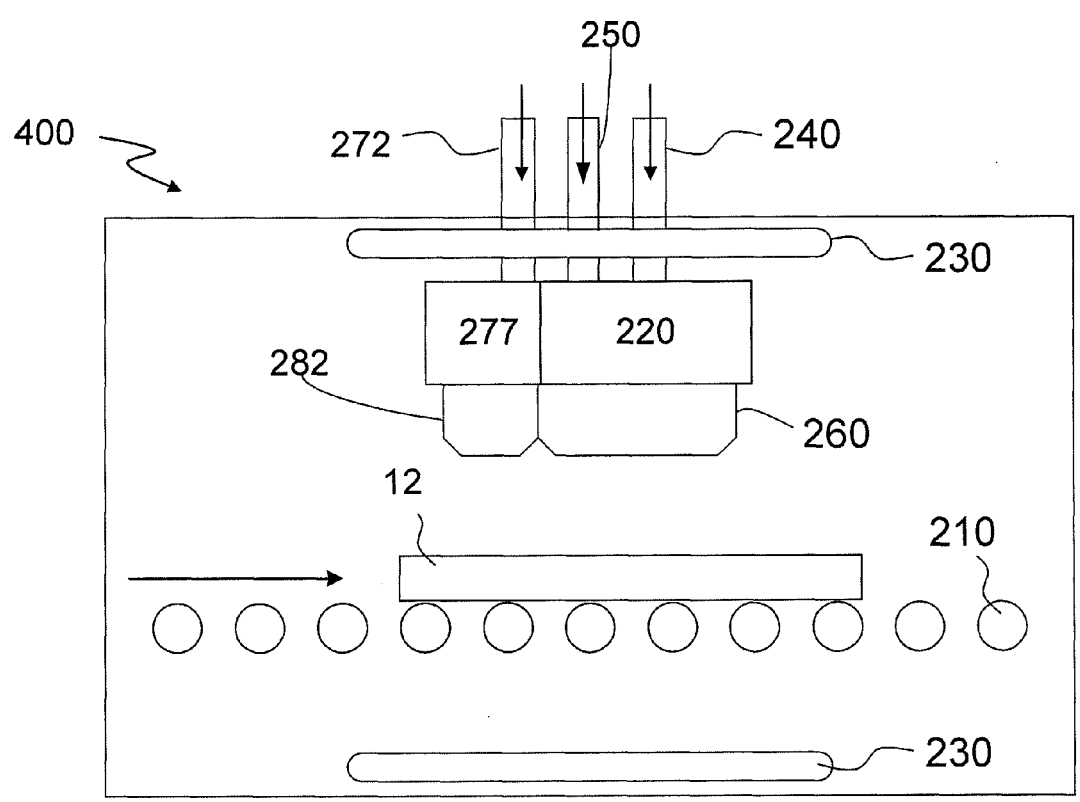
FIG. 4 is a schematic of a deposition oven used for chloride treatment during reflector layer deposition according to an embodiment described herein.

FIG. 4 illustrates a schematic of a deposition oven 400 used for chloride treatment of the absorber layer 106 while the reflector layer is deposited over the absorber layer 106. This occurs in lieu of chloride treatment during absorber layer deposition. In this embodiment, the chlorine atoms of the chloride compound deposited over the reflector layer diffuse into the absorber layer 106 during the anneal. Although a reflector layer formed of zinc telluride is described, the semiconductor reflector layer may be formed of any suitable semiconductor material.

The oven 400 is substantially similar to the oven 200 of the FIG. 2 except that the input line 270, the first in-situ vaporization unit 275 and the diffuser 280 are omitted. This is because the reflector layer may be deposited using an input line, vaporization unit and diffuser separate from those used for absorber layer deposition. Reflector layer raw material powder such as zinc telluride can be supplied by a semiconductor input line 272 to an in-situ vaporization unit 277 where it is vaporized. Zinc telluride vapor is then deposited through a diffuser 282 onto the unfinished device 12 being transported in a continuous process in a desired amount. Chloride compound is provided through input line 250, to in-situ vaporization unit 220 and diffuser 260. The chloride compound and annealing parameters are the same as those described above with respect to FIG. 2.

Figure 5A:
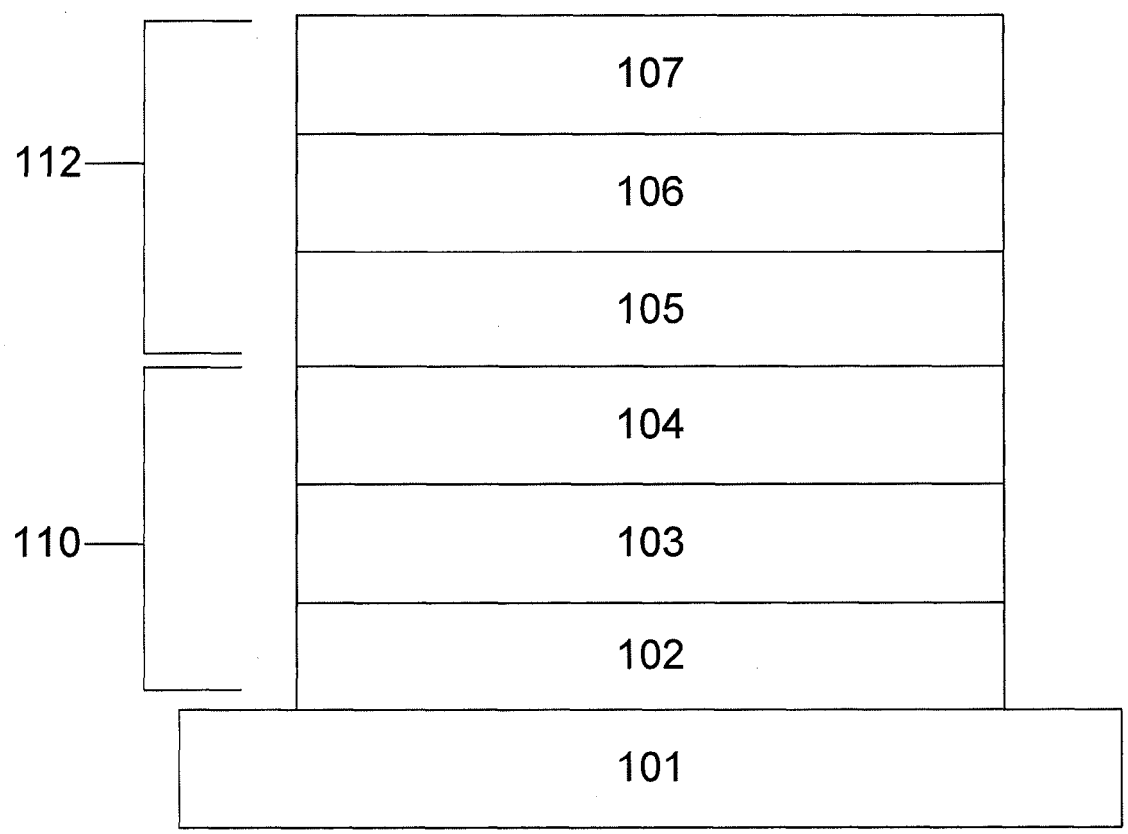
FIG. 5A is a cross-sectional view of an unfinished photovoltaic device having an exemplary semiconductor tri-layer.
Figure 5B:
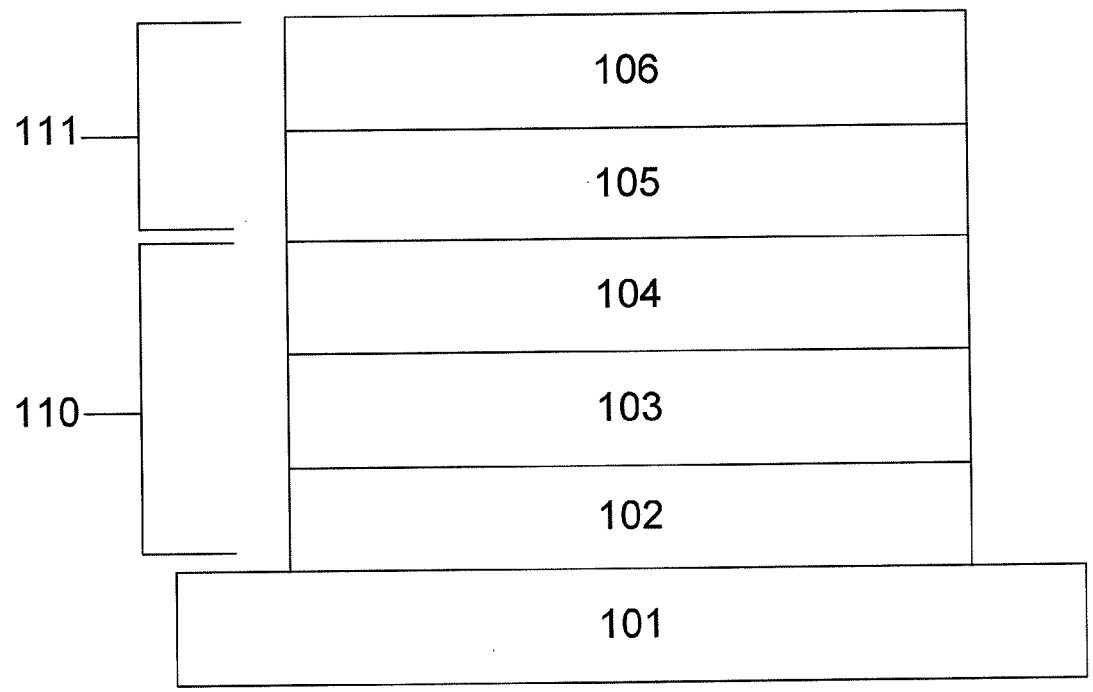
FIG. 5B is a cross-sectional view of an unfinished photovoltaic device having an exemplary semiconductor bi-layer.

FIGS. 5A and 5B respectively illustrate a schematic of a photovoltaic device 14A and 14B after semiconductor layer 112 and 111 deposition. Semiconductor layer 112 has a tri-layer form, which includes a reflector layer 107 formed over the absorber layer 106, which is formed over the window layer 105. Semiconductor layer 111 has a bi-layer form, which includes absorber layer 106 formed over window layer 105. The absorber layer 106 in FIGS. 5A and 5B has not yet been treated with a chloride compound.

Figure 9:
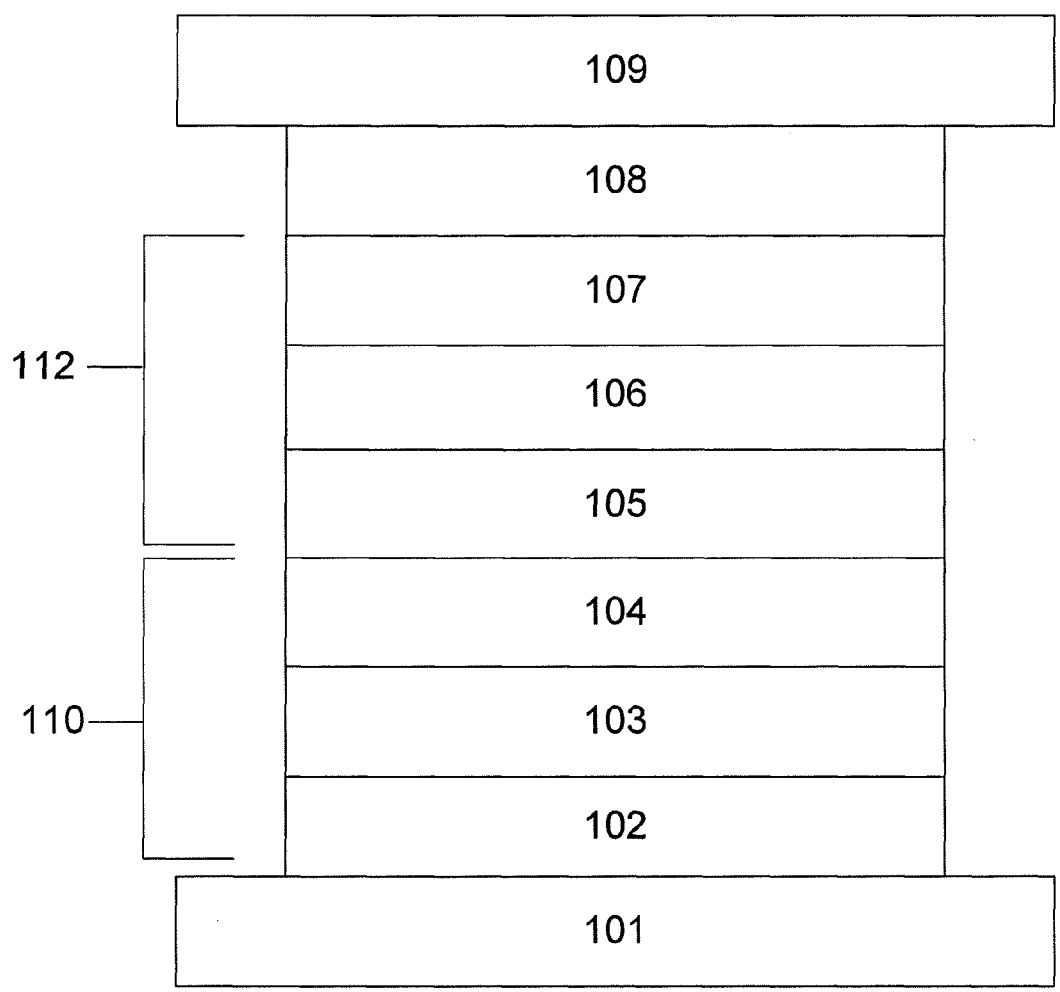
FIG. 9 is a cross-sectional view of a completed photovoltaic device according to an embodiment.
Figure 10:
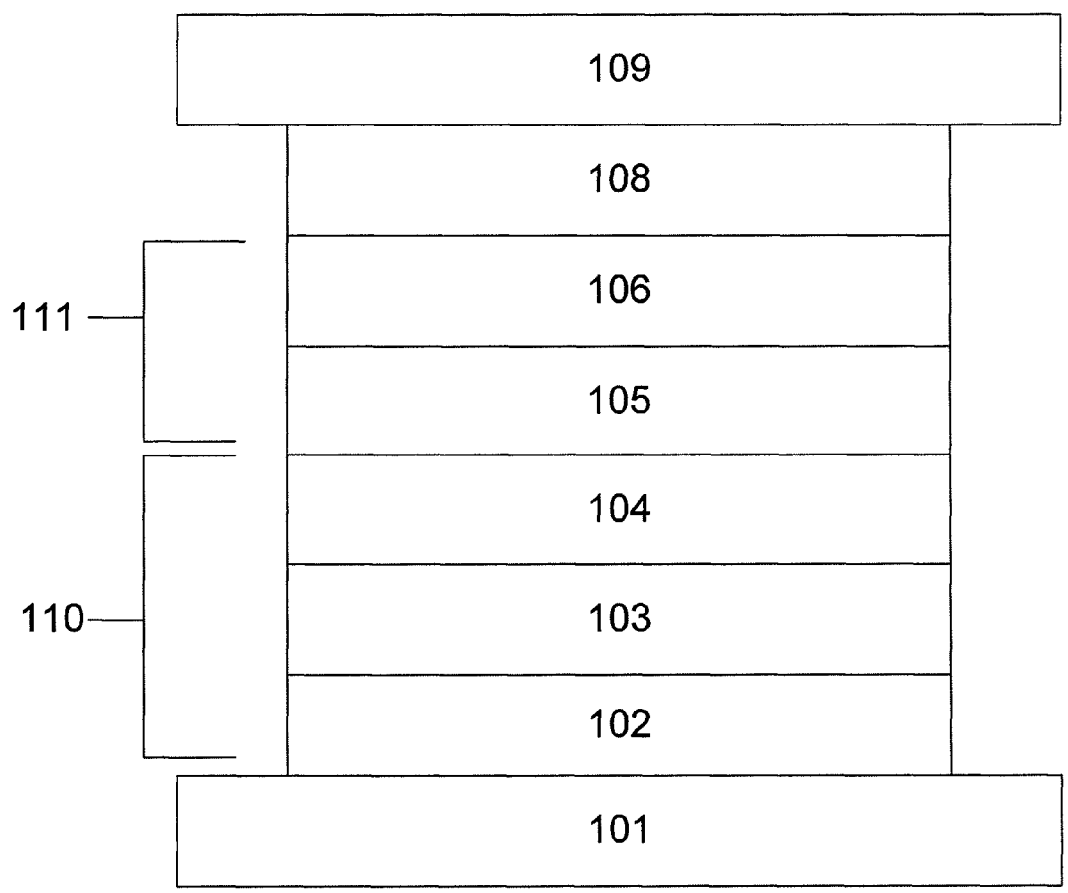
FIG. 10 is a cross-sectional view of a completed photovoltaic device according to an embodiment.

As described above, semiconductor layer 112 having a tri-layer form including the reflector layer 107 is advantageous to the extent that the reflector layer 107 minimizes electron recombination with hole carriers at the back contact layer 108 (see FIG. 9 and FIG. 10). Limiting recombination improves photoconversion efficiency, or the rate of conversion of photons to electric current. However, the additional reflector layer 107 deposition step does add time and cost to the photovoltaic device manufacturing process flow.

Figure 6:
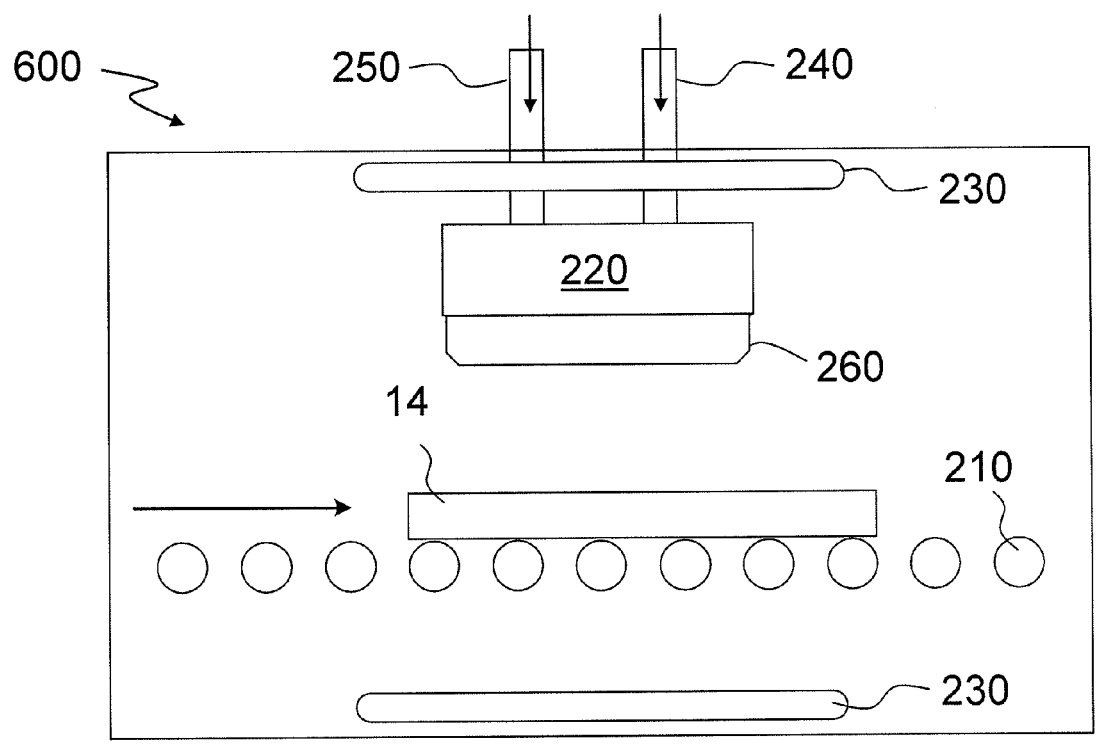
FIG. 6 is a schematic of a deposition oven used for chloride treatment after deposition of a semiconductor layer according to an embodiment described herein.

FIG. 6 is a schematic of a deposition oven used for chloride treatment of the absorber layer after deposition of the semiconductor layer 112 or 111 according to an embodiment. As described above, the reflector layer 107 may be formed of zinc telluride or any other suitable semiconductor material.

The oven 600 is substantially similar to oven 200 of FIG. 2 except that the semiconductor input line 270, the first in-situ vaporization unit 275, and the diffuser 280 of FIG. 2 are omitted. Such semiconductor deposition structures are omitted because the chloride compound is not being deposited during semiconductor deposition in this embodiment. Semiconductor deposition occurred in a previous zone of the oven 600, or in a separate oven. An unfinished photovoltaic device 14 (FIG. 5A or FIG. 5B) is transported through the oven 600 on a transport mechanism. A chloride compound is deposited in a fashion substantially similar to FIG. 2. The chloride compound employed can be formed of a chloride compound containing one or more elements from Groups 1-11, zinc, mercury and copernicium (e.g., manganese chloride or magnesium chloride). The chloride compound can be deposited in vapor or liquid form, for example, about a 0.14 molar to about a 2.18 molar aqueous solution, or about a 0.5 molar to about a 1.2 molar aqueous solution. Either during or following chloride deposition, the absorber layer 106 of the unfinished photovoltaic device 14 (FIG. 5A or FIG. 5B) is heated at about 400° C. to about 460° C., or at about 435° C. to about 445° C. if a 0.54 molar aqueous solution is provided, or at about 400° C. to about 450° C. if about a 1.1 molar aqueous solution is provided, for about 7 minutes to about 12 minutes, or about 11 minutes.

Figure 7:
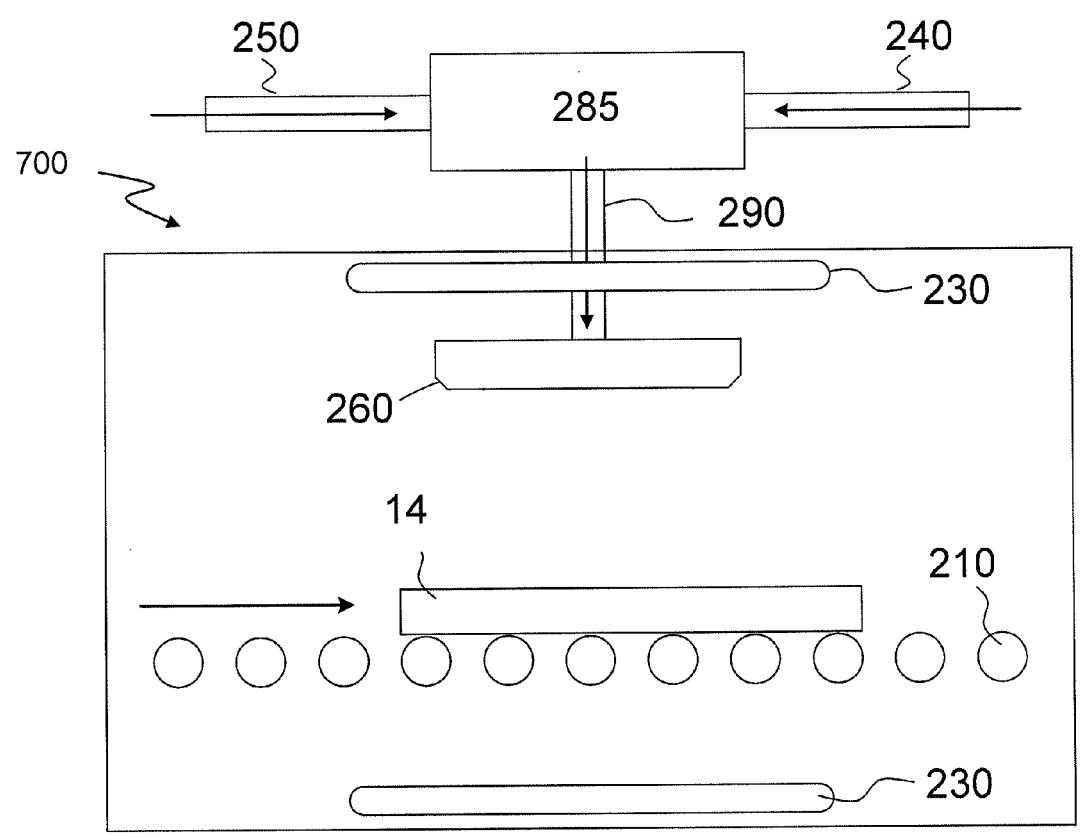
FIG. 7 is a schematic of a deposition oven used for chloride treatment after deposition of a semiconductor layer according to another embodiment described herein.

FIG. 7 illustrates a schematic of an oven 700 used for chloride treatment of the absorber layer 106 after deposition of the absorber layer 106 (FIG. 5B) or the reflector layer 107 (FIG. 5A). In lieu of second in-situ vaporization unit 220, an ex-situ vaporization unit 285 is provided to vaporize the chloride compound outside an oven 700. The chloride compound employed can be formed of a chloride compound containing one or more elements from Groups 1-11, zinc, mercury and copernicium, for example, manganese chloride or magnesium chloride. The vaporized chloride compound may then be provided through an input line 290 to the diffuser 260 which deposits the chloride compound onto the unfinished photovoltaic device 14. Chloride compound may be provided to the ex-situ vaporization unit 285 through input line 250, for example, in solid (e.g., powder) form or in liquid form, e.g., an aqueous solution having a concentration described with respect to FIG. 6. A carrier gas may optionally be supplied to the ex-situ vaporization unit 285 through optional carrier gas input line 240 to carry and distribute the vaporized chloride compound to the diffuser 260. Alternatively, the carrier gas may be omitted and the chloride compound vapor may diffuse through the input line 290 under ambient conditions. Chloride compound vapors are introduced through the diffuser 260 and deposited in an amount and at an appropriate location onto the moving unfinished device 14A or 14B to achieve a desired amount of chloride compound deposited onto the absorber layer 106 (FIG. 5B) or onto the reflector layer 107 (FIG. 5A) to diffuse into the absorber layer 106. Either during or following chloride treatment, the absorber layer 106 is heated according to the parameters described above with respect to FIG. 6.

Figure 8:
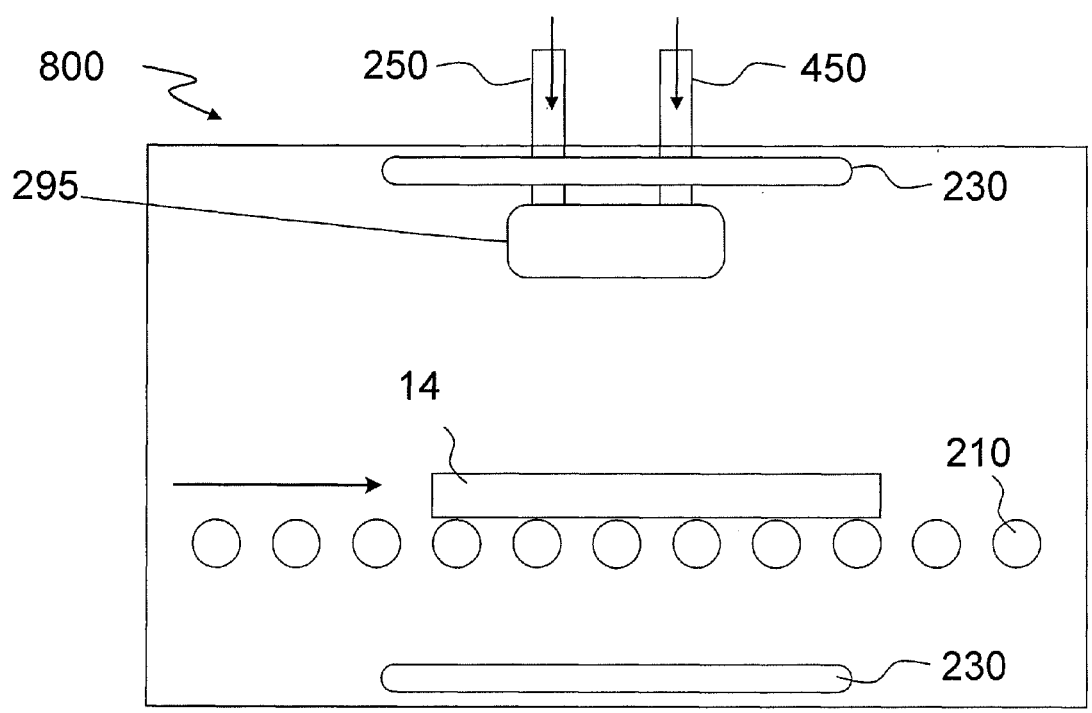
FIG. 8 is a schematic of a deposition oven used for chloride treatment after deposition of a semiconductor layer according to another embodiment described herein.

FIG. 8 illustrates a schematic of a deposition oven used for chloride treatment after deposition of the semiconductor layers according to another embodiment. This is another method of chloride treatment of the unfinished photovoltaic device 14A or 14B. Instead of being deposited in vapor form, the chloride compound may be deposited in liquid form using an oven 800 which is substantially similar to the oven 600 of FIG. 6 except that a sprayer 295 deposits the liquid chloride compound onto the unfinished device 14. Input line 250 provides liquid chloride compound to the sprayer 295. An optional second input line 450 may also supply liquid chloride compound to the sprayer 295. The chloride compound employed can be formed of a chloride compound containing one or more elements from Groups 1-11, zinc, mercury and copernicium, for example, manganese chloride or magnesium chloride. Similar to the FIG. 6 embodiment, the chloride compound supplied to the sprayer 290 can be a 0.14 molar to about a 2.18 molar aqueous solution, or about a 0.5 molar to about a 1.2 molar aqueous solution, for example, about a 1.1 molar or about a 0.54 molar aqueous solution. Either during or following chloride treatment, the absorber layer 106 is heated according to the parameters described above with respect to the FIG. 6 embodiment.

FIG. 9 illustrates a completed photovoltaic device 20 containing a reflector layer 107. FIG. 10 illustrates a completed photovoltaic device 30 with the semiconductor reflector layer 107 omitted. As shown in FIGS. 9 and 10, following the chloride compound deposition and annealing of the absorber layer 106, a back contact layer 108 may be deposited onto respective semiconductor layers 112, 111 to serve as a back contact for photovoltaic device 20, 30 and a back support 109 is applied. Back contact layer 108 may be formed of one or more highly conductive materials, for example, molybdenum, aluminum, copper, silver, gold, or any combination thereof, providing a low-resistance ohmic contact. Back support 109 can be composed of any suitable protective material, and is typically formed of a substrate such as borosilicate glass, float glass, soda lime glass, carbon fiber, or polycarbonate. Back support 109, in combination with substrate 101 and an edge seal (applied on to the sides of the devices 20 and 30), protect the plurality of layers of devices 20 and 30 from moisture intrusion, physical damage, and environmental hazards.

Figure 11:
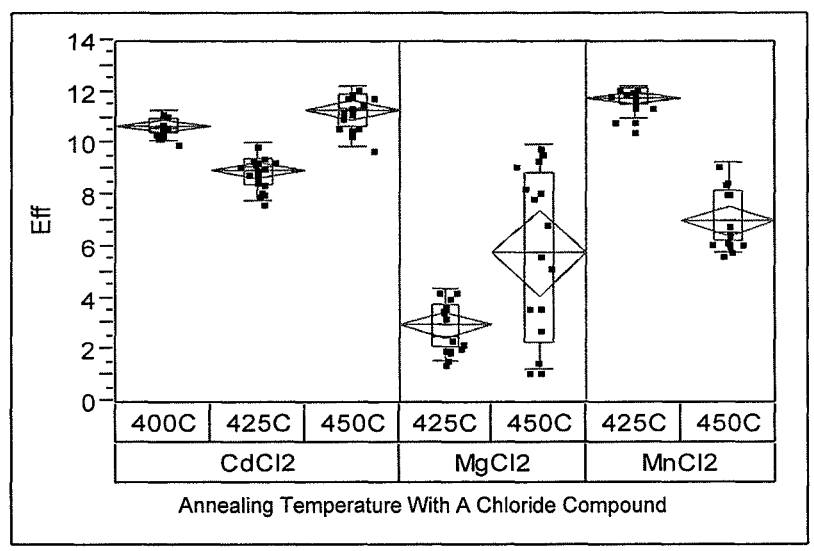
FIG. 11 is a graph illustrating the effect of treatment with different chloride compounds on photovoltaic device efficiency.

Treating the cadmium telluride layer 106 with a chloride compound containing one or more elements from Groups 1-11, zinc, mercury and copernicium, for example, manganese chloride or magnesium chloride, provides several advantages over a cadmium chloride treatment. FIG. 11 compares a cadmium chloride treatment with a manganese chloride and magnesium chloride treatment. The y-axis measures the efficiency of a photovoltaic device expressed as a percentage derived from the power output of the device divided by the product of incident radiation and the photon collection area of the device. The x-axis shows respective treatment of the device with cadmium chloride, magnesium chloride and manganese chloride at temperatures of 400° C., 425° C. and 450° C. In this experiment, cadmium telluride films were sprayed with an 1.1M aqueous solution of the respective chlorides shown on the x-axis. After the surface dried, the films were heated in air at the temperatures shown on the x-axis for about 11 minutes. As shown in FIG. 11, it has been found that photovoltaic devices having cadmium telluride treated with manganese chloride, for example, are equally as efficient as devices treated with cadmium chloride. Like cadmium chloride, the above chloride compounds provide chlorine atoms which diffuse through the grain boundary areas of the cadmium telluride film and facilitate re-crystallization of the cadmium telluride film. Although FIG. 11 illustrates only manganese chloride and magnesium chloride, the invention is not thus restricted, as discussed above.

It has also been determined that magnesium chloride and manganese chloride, for example, do not react with zinc telluride, a potential semiconductor reflector layer for photovoltaic devices. Manganese chloride or magnesium chloride could be used to treat the absorber layer in a device having a semiconductor reflector layer such as zinc telluride to avoid erosion of the reflective properties of a zinc telluride reflector layer. Furthermore, manganese chloride and magnesium chloride also have lower vapor pressures than cadmium chloride, potentially allowing annealing to occur at higher temperatures, for example, from about 400° C. to about 750° C., than are possible for cadmium chloride treatment due to evaporation. This allows for chloride treatment at conditions of absorber layer 106 (or reflector layer 107) deposition, described with respect to FIGS. 2 and 4.

Each layer in the disclosed embodiments may, in turn, include more than one layer or film. Additionally, each layer can cover all or a portion of a photovoltaic device and/or all or a portion of the layer or substrate underlying the layer. For example, a "layer" can include any amount of any material that contacts all or a portion of a surface. If a layer is formed "over" another layer, those layers are not required to be in contact.

Details of one or more embodiments are set forth in the accompanying drawings and description. Other features, objects, and advantages will be apparent from the description, drawings, and claims. Although a number of embodiments have been described, it will be understood that various modifications may be made without departing from the spirit and scope of the invention. It should also be understood that the appended drawings are not necessarily to scale, presenting a somewhat simplified representation of various features and basic principles of the invention.

What is claimed as new and desired to be protected by Letters Patent of the United States is:

1. A method of manufacturing a photovoltaic device, the method comprising:
   depositing a cadmium telluride layer over a substrate;
   treating the cadmium telluride layer with a chloride compound comprising chlorine and one or more elements selected from the group consisting of an element from Groups 1-11, zinc, mercury and copernicium, wherein the cadmium telluride layer is treated during at least a portion of cadmium telluride deposition;
   annealing the cadmium telluride layer; and
   following cadmium telluride deposition, depositing a semiconductor reflector layer over the cadmium telluride layer.

2. The method of claim 1, wherein the chloride compound reduces erosion of the semiconductor reflector layer compared to a cadmium chloride treatment of the cadmium telluride layer.

3. The method of claim 1, wherein the semiconductor reflector layer comprises zinc telluride.

4. The method of claim 1, wherein the cadmium telluride layer is annealed after the cadmium telluride layer is treated.

5. The method of claim 1, wherein the cadmium telluride layer is annealed during at least a portion of the treatment step.

6. The method of claim 1, wherein the chloride compound comprises manganese chloride.

7. The method of claim 1, wherein the chloride compound comprises magnesium chloride.

8. The method of claim 1, wherein the cadmium telluride layer is annealed at a temperature from about 350° C. to about 750° C.

9. The method of claim 8, wherein the cadmium telluride layer annealed at a temperature from about 400° C. to about 460° C.

10. The method of claim 9, wherein the cadmium telluride layer is annealed at a temperature from about 415° C. to about 455° C.

11. The method of claim 10, wherein the cadmium telluride layer is annealed at a temperature from about 435° C. to about 445° C.

12. The method of claim 1, wherein the chloride compound comprises from about a 0.14 molar to about a 2.18 molar aqueous solution.

13. The method of claim 12, wherein the chloride compound comprises from about a 0.5 molar to about a 1.2 molar aqueous solution.

14. The method of claim 1, wherein the cadmium telluride layer is annealed for about 7 minutes to about 12 minutes.

* * * * *